United States Patent [19]

Krause

[11] 4,090,149
[45] May 16, 1978

[54] INTEGRATED DEGENERATIVE AMPLIFIER

[75] Inventor: Gerhard Krause, Rosenheim, Egarten, Germany

[73] Assignee: Siemens Aktiengesellschaft, Berlin & Munich, Germany

[21] Appl. No.: 731,432

[22] Filed: Oct. 12, 1976

[30] Foreign Application Priority Data

Nov. 5, 1975 Germany ............................ 2549667

[51] Int. Cl.² .............................................. H03F 3/14
[52] U.S. Cl. .................. 330/293; 307/299 B; 330/307; 330/308
[58] Field of Search ................... 330/28, 33, 38 M, 59; 307/299 B; 357/36

[56] References Cited

U.S. PATENT DOCUMENTS

| | | | |
|---|---|---|---|
| 3,710,269 | 1/1973 | Fowler et al. ................. | 330/38 M X |
| 3,725,683 | 4/1973 | Anderson ......................... | 307/299 B |
| 3,822,387 | 7/1974 | Mulder ............................. | 307/299 B |

OTHER PUBLICATIONS

IEEE Journal of Solid-State Circuits, vol. SC-7, No. 5, Oct. 1972, pp. 340-351.

*Primary Examiner*—James B. Mullins
*Attorney, Agent, or Firm*—Hill, Gross, Simpson, Van Santen, Steadman, Chiara & Simpson

[57] ABSTRACT

An integrated circuit degenerative feedback current amplifier has at least two amplifier stages and a degenerative feedback branch connected from the amplifier input to the amplifier output. An active element of the last amplifier stage has its output circuit subdivided in such a way that a subdivision of the output current results whereby a first partial current is guided via the degenerative branch and a second partial current is guided into the amplifier output.

8 Claims, 4 Drawing Figures

INTEGRATED DEGENERATIVE AMPLIFIER

BACKGROUND OF THE INVENTION

1. Field of the Invention

The present invention relates to an integrated degenerative amplifier, and more particularly to a current amplifier with at least two amplifier stages and a degenerative feedback branch guided from the amplifier output to the amplifier input.

2. Description of the Prior Art

Analog amplifiers, which are used for amplifying detector output signals, must have degenerative coupling to achieve stability. Photo-detectors, for instance, function as a current source so that the amplifier must be constructed as a current amplifier.

If such amplifiers are constructed as integrated circuits, it would be preferable to embody the circuit without resistors, and particularly without degenerative feedback resistors, since resistors with a high resistance value are difficult to produce in integrated circuit techniques. Integrated resistors require a relatively large surface in the integrated circuit so that no great packing densities can be obtained in the integrated circuit. Since the magnitude of the resistance value which can be realized in integrated circuits is limited, only average current sensitivities can be obtained in fully integrated degenerative amplifiers.

However, problems also occur when external degenerative feedback resistors are used in highly sensitive current amplifiers. In the case of photodiodes in automatic exposure systems for photographic cameras, for instance, the photocurrent in the most sensitive range amounts to a few pico-amperes. The degenerative feedback resistance should then be greater than $10^{10}$ Ohms. Such resistances, however, have dimensions which are too large for automatic exposure systems and are also too expensive.

SUMMARY OF THE INVENTION

It is an object of the present invention to provide an integrated circuit amplifier without the use of degenerative feedback resistors.

This object is achieved with the integrated circuit amplifier of this invention such that the active element of the last amplifier stage has its output circuit subdivided so that a subdivision of the output current results whereby a partial current is guided into the degenerative feedback branch, and a partial current is guided into the amplifier output.

If the active element of the last amplifier stage is a bipolar transistor, then it is provided with two collectors for the purpose of the above mentioned current division.

The amplifier, in accordance with this invention, also has the advantage that the active element of the first amplifier stage may simultaneously be provided as a photo-detector.

Furthermore, the operating-point adjustment of the active amplifier elements may be effected by way of charge-carrier injection or by way of light radiation, so that resistors for operating-point adjustment, which might possibly be otherwise necessary, can be left out.

DESCRIPTION OF THE PREFERRED EMBODIMENTS

Figure 1:
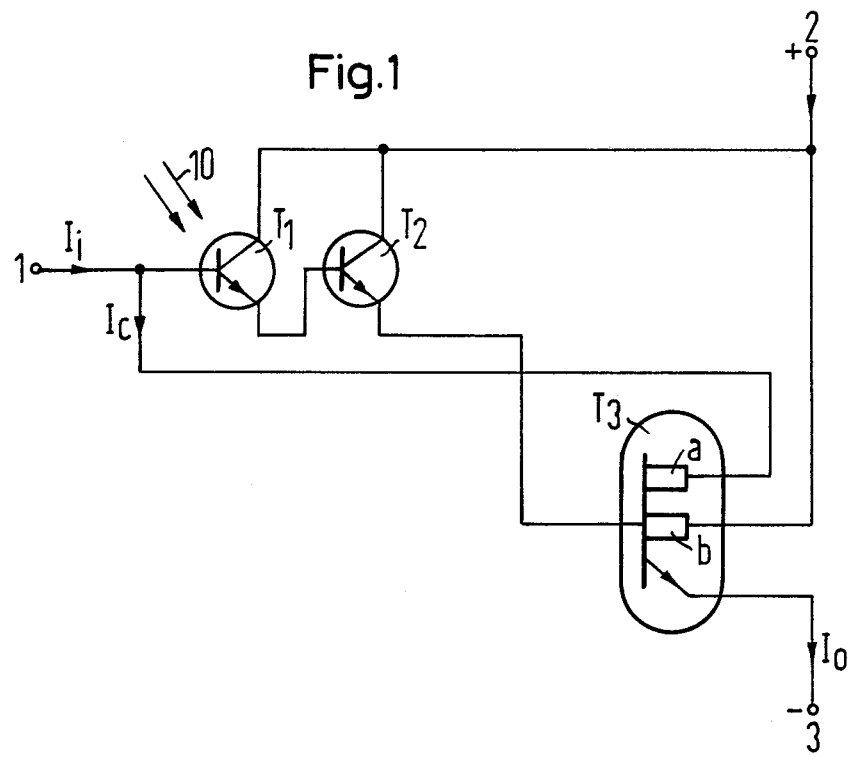
FIG. 1 illustrates a circuit diagram of an embodiment of the amplifier in accordance with the invention.

In accordance with the circuit diagram of FIG. 1, an amplifier in accordance with this invention comprises two amplifier stages with transistors $T_1$ and $T_2$ connected as a Darlington stage. An input current $I_i$ is fed into the amplifier at terminal 1. A transistor $T_3$ is connected behind the Darlington stage, and is provided with two collectors $a$ and $b$. The path formed by the collector $b$ and the emitter of this transistor represents the output circuit of the amplifier, where an output current $I_0$ is available at terminal 3. The other collector $a$ is guided back to the input 1 of the amplifier and forms a degenerative feedback branch. The operational voltage is supplied at terminal 2.

A current $I_f$ flowing towards the current divider transistor $T_3$ is branched off from the input current $I_i$ which is to be amplified. The remainder of this current is amplified in transistors $T_1$ and $T_2$ which are connected as a Darlington amplifier. The output current of the Darlington amplifier flows into the base of the current divider transistor $T_3$. The inverse current guided to collector $a$ corresponds to a degenerative coupling, while the collector $b$ supplies the amplifier output current $I_0$. The current ratio is fixed by the current transmission factors of the two collectors. This ratio is very close to being constant, i.e., the degenerative amplifier has an almost constant amplification within a large range of input current, temperature and frequency, without requiring the use of an active component element.

Such an amplifier in accordance with FIG. 1 may, for instance, be directly used for light measurement when the transistor $T_1$ is used as a photo-detector. The incident light radiation is there schematically indicated by arrows 10. In this case, a signal input at input 1 does not occur.

Figure 2:
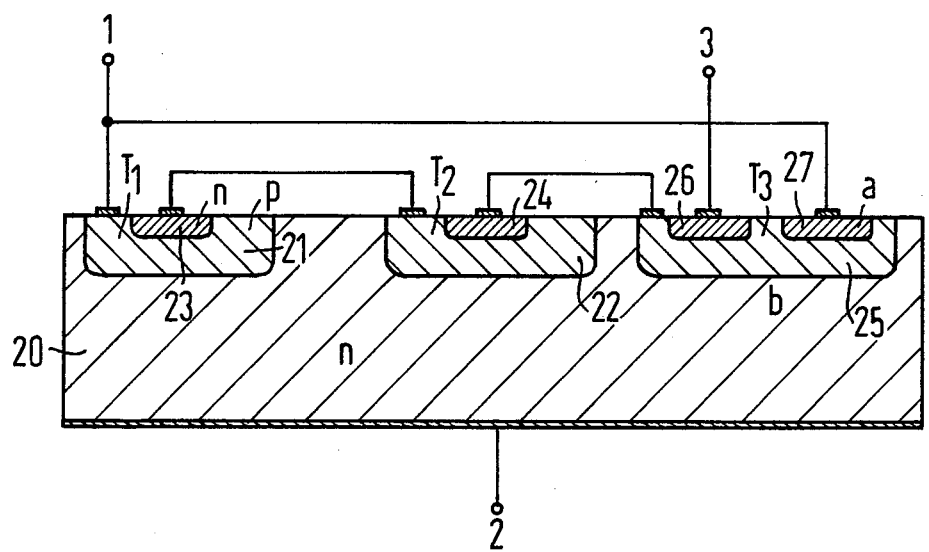
FIG. 2 illustrates an embodiment of the amplifier of FIG. 1 as an integrated circuit.

FIG. 2 shows an embodiment of the amplifier of FIG. 1 as an integrated circuit.

The two transistors $T_1$ and $T_2$ are produced within a semiconductor member 20 in conventional planar technique, whereby the transistor bases are formed by two zones 21 and 22 and the emitters are formed by two zones 23 and 24. A further zone 25 forms the base of the current-divider transistor $T_3$, while a zone 26 forms the emitter of this transistor.

The semiconductor member 20 forms a collector, namely the collector $b$, while a further zone 27 forms another collector, namely the collector $a$. The remainder of the circuit in accordance with FIG. 1 results by providing contacts and connection lines which have been shown schematically and which have not been discussed in detail.

As shown in FIG. 2, the current divider transistor is formed by a vertical partial transistor (zones 25, 26) as well as a lateral transistor (zones 25, 26, 27). This arrangement is advantageous where a Darlington amplifier is used as a preliminary low-level stage and/or when photo-detectors are employed. It is preferable that the partial transistor supplying the output current has a vertical transistor structure and the partial transistor supplying the degenerative feedback signal has a lateral structure.

Figure 3:
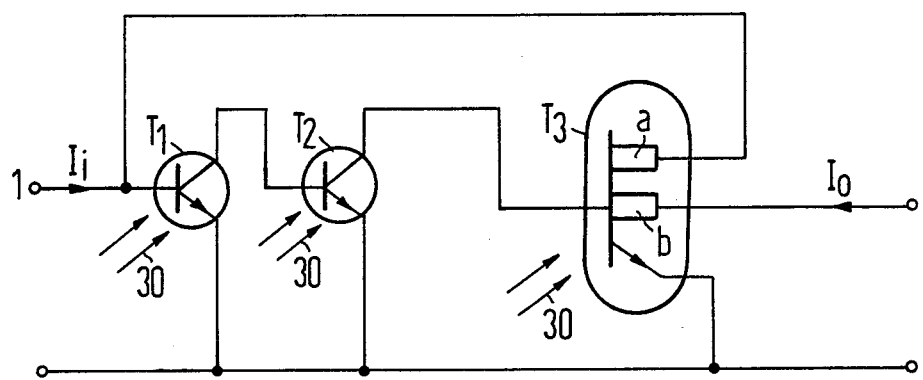
FIG. 3 illustrates a circuit diagram of another embodiment of an amplifier in accordance with this invention.

For the alternative embodiment of FIG. 3, elements which are the same as those in FIG. 1 have been denoted with the same reference numerals. In this circuit, a voltage supply is eliminated and replaced by light radiation on the active component elements. The modes of operation of such a form of voltage supply is described in detail in "IEEE Journal of Solid-State Circuits" Vol. SC 7 Nr. 5, Oct. 72, p. 340–351 and in DT-OS No. 2,344,099 esp. claim 1 and 2 and pages 10–12.

Figure 4:
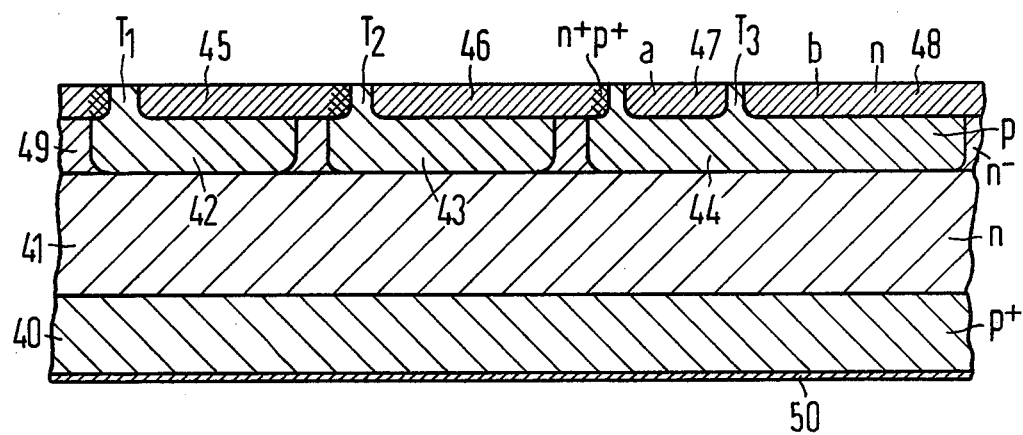
FIG. 4 illustrates an embodiment of the amplifier of FIG. 3 as an integrated circuit.

In the case of the integrated circuit embodiment shown in FIG. 4, a pn-junction between two zones 40 and 41 forms an injecting pn-junction which provides the required charge carriers for the voltage supply. The zone 40 is thereby provided with an electrode 50 on its entire surface. Base zones 42, 43 and 44 are provided in a zone 49 overlying the zone 41. Zone 49 has a lesser conductivity compared with zone 41 but the same conductivity type, while zones 45, 46, 47 and 48 form collector zones.

The zone 41 forms the emitters for the transistor $T_1$, $T_2$ and $T_3$. This embodiment corresponds to the circuit of FIG. 3 and the connections, which are additionally required, may be constructed in known manner and are not shown.

The principal of current division in accordance with this invention, is not limited to bipolar transistors. It may also be used in the case of field effect transistors in an analogous manner, such as by way of channel division.

A further advantage of the amplifier of this invention is that no special insulation measures such as insulation diffusions, are required between the individual stages of the integrated circuit (see for instance FIG. 2).

Although various minor modifications may be suggested by those versed in the art, it should be understood that I wish to embody within the scope of the patent warranted hereon, all such embodiments as reasonably and properly come within the scope of my contribution to the art.

I claim as my invention:

1. In an integrated circuit degenerative feedback current amplifier having an energy supply, at least two amplifier stages including an input amplifier stage in a common collector configuration connected to said energy supply and a single feedback branch, said branch being degeneratively directly connected from an output of the amplifier to an input of the input amplifier stage, the improvement comprising an active element of the last amplifier stage having an output circuit subdivided for a subdivision of the output current into first and second partial currents, the first partial current being connected to the feedback branch and the second partial current being connected to the amplifier output.

2. The amplifier of claim 1, characterized in that said active element of the last amplifier stage is a bipolar transistor with at least two collectors.

3. The amplifier of claim 1, characterized in that said subdivided output circuit comprises a bipolar planar transistor in a semiconductor body with a vertical and a lateral transistor structure therein with respect to a face containing diffused regions of the transistor, said lateral transistor supplying said first partial current to the feedback branch.

4. The amplifier of claim 1, characterized in that the active element of the first amplifier stage comprises a photo-detector.

5. The amplifier of claim 1, characterized in that the energy supply provided for active amplifier elements comprises means for charge-carrier injection.

6. The amplifier of claim 1 in which the energy supply provided for active amplifier elements comprises means for charge-carrier injection by light radiation.

7. The amplifier of claim 1, characterized in that the input amplifier stage provided in front of the last amplifier stage is embodied as a Darlington circuit.

8. The amplifier of claim 1, characterized in that the last amplifier stage comprises a transistor having a collector which supplies the first partial current as degenerative feedback to the base of a transistor provided in the first amplifier stage.

* * * * *